United States Patent
Funakoshi et al.

(10) Patent No.: US 7,301,487 B2
(45) Date of Patent: Nov. 27, 2007

(54) IMAGE SENSOR CAPABLE OF CANCELLING OFFSET VOLTAGE OF SEMICONDUCTOR DEVICE INCLUDED THEREIN

(75) Inventors: Jun Funakoshi, Kawasaki (JP); Toshitaka Mizuguchi, Kawasaki (JP); Tsuyoshi Higuchi, Kawasaki (JP); Katsuyoshi Yamamoto, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 11/429,158

(22) Filed: May 8, 2006

(65) Prior Publication Data
US 2007/0052564 A1    Mar. 8, 2007

(30) Foreign Application Priority Data
Sep. 7, 2005 (JP) .............. 2005-259964

(51) Int. Cl.
*H03M 1/00* (2006.01)
(52) U.S. Cl. .................................... 341/122
(58) Field of Classification Search ........ 348/246, 348/241, 300, 222.1; 257/204; 341/122
See application file for complete search history.

(56) References Cited

U.S. PATENT DOCUMENTS

| | | | |
|---|---|---|---|
| 6,885,396 B1* | 4/2005 | Panicacci et al. | 348/241 |
| 2004/0075759 A1* | 4/2004 | Sato et al. | 348/246 |
| 2005/0168601 A1 | 8/2005 | Lim | |

FOREIGN PATENT DOCUMENTS

| | | |
|---|---|---|
| JP | 2001-128070 A | 5/2001 |
| JP | 2002-218324 A | 8/2002 |
| KR | 2005-78898 | 8/2005 |

* cited by examiner

*Primary Examiner*—Rexford Barnie
*Assistant Examiner*—Joseph Lauture
(74) *Attorney, Agent, or Firm*—Arent Fox, LLP

(57) ABSTRACT

An image sensor includes: a pixel unit that outputs a first signal including an offset voltage inherent to a pixel; a CDS unit that performs correlated double sampling of a second signal that is obtained from the first signal by canceling the offset voltage inherent to the pixel, and outputs the second signal after the correlated double sampling as a third signal including an offset voltage due to the CDS unit; and an ADC unit that performs analog-to-digital conversion of a fourth signal that is obtained from the third signal by canceling the offset voltage due to the CDS unit.

20 Claims, 5 Drawing Sheets

IMAGE SENSOR CAPABLE OF CANCELLING OFFSET VOLTAGE OF SEMICONDUCTOR DEVICE INCLUDED THEREIN

CROSS-REFERENCE TO RELATED APPLICATIONS

This application is based upon and claims the benefit of priority from the prior Japanese Patent Application No. 2005-259964, filed on Sep. 7, 2005, the entire contents of which are incorporated herein by reference.

BACKGROUND OF THE INVENTION

1. Field of the Invention

The present invention relates to an image sensor (e.g., a CMOS sensor) that includes a semiconductor device (e.g., an amplifier) and can cancel the offset voltage of the semiconductor device with a simple circuit configuration.

2. Description of the Related Art

Although a charged coupled device (CCD) is conventionally used widely in an image sensor, an image sensor using a complementary metal oxide semiconductor (hereinafter, "CMOS sensor") is also widely used recently. Since the CMOS sensor has lower power consumption as compared to the CCD and the already wide spread transistor manufacturing process can be applied to the CMOS sensor, costs can be constrained to a lower level.

Generally, the CMOS sensor is constituted by a pixel unit, a correlated double sampling (CDS) unit, and an analog-to-digital converter (ADC) unit. The pixel unit reads light with a light-sensitive element such as a photo diode (PD), converts the light to an electric signal corresponding to the level of the light quantity and outputs the electric signal.

The CDS unit samples an output level in the case of an offset state without the signal input from the pixel unit and an output level when the electric signal is output to compare two output levels. By obtaining the difference of the comparison, variations in the output value are canceled in each semiconductor device constituting the pixel unit to detect only the pure electric signal.

The ADC unit converts the electric signal input from the CDS unit from an analog signal to a digital signal and outputs the signal as a detected value of one pixel. Recently, to improve a detection speed, a column-type CMOS sensor with a plurality of the above-described COMS sensors arranged in a row has been disclosed (e.g., Japanese Patent Application Laid-Open Nos. 2001-128070 and 2002-218324).

However, in the case of a column-type CMOS sensor, it is problematic that variations in a detected value of each CMOS sensor are displayed as vertical stripes on an image unless variations among the CMOS sensors arranged in the same column.

Although variations in the output of the pixel unit are canceled by the CDS unit in the case of CMOS sensors of Japanese Patent Application Laid-Open Publication Nos. 2001-128070 and 2002-218324 described above, since variations are actually generated due to offsets in a semiconductor device such as an amplifier arranged at a stage after the CDS unit as well as in a semiconductor device such as a comparator of the ADC unit, it is problematic that the variations are displayed as vertical stripes on an image.

For example, if it is configured such that the amplifier is not arranged to prevent the variations due to the amplifier arranged at a stage after the CDS unit, the output of the CDS unit is capacitively divided by a semiconductor device such as a condenser provided in the ADC unit and problematically attenuated to the extent that cannot drive the ADC unit.

On the other hand, in Japanese Patent Application Laid-Open Nos. 2001-128070 and 2002-218324, if a cancel function is added to constrain the variations generated in the semiconductor device such as the amplifier and the comparator at a stage after the CDS unit, since a circuit configuration is made complicated and a circuit scale is increased, it is problematic that the manufacturing cost is increased.

SUMMARY OF THE INVENTION

It is an object of the present invention to at least solve the problems in the conventional technology.

An image sensor according to an aspect of the present invention includes: a pixel unit that outputs a first signal including an offset voltage inherent to a pixel; a correlated double sampling (CDS) unit that performs correlated double sampling of a second signal that is obtained from the first signal by canceling the offset voltage inherent to the pixel, and outputs the second signal after the correlated double sampling as a third signal including an offset voltage due to the CDS unit; and an analog-to-digital converter (ADC) unit that performs analog-to-digital conversion of a fourth signal that is obtained from the third signal by canceling the offset voltage due to the CDS unit.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Exemplary embodiments of the present invention will be described in detail with reference to the accompanying drawings.

Figure 1:
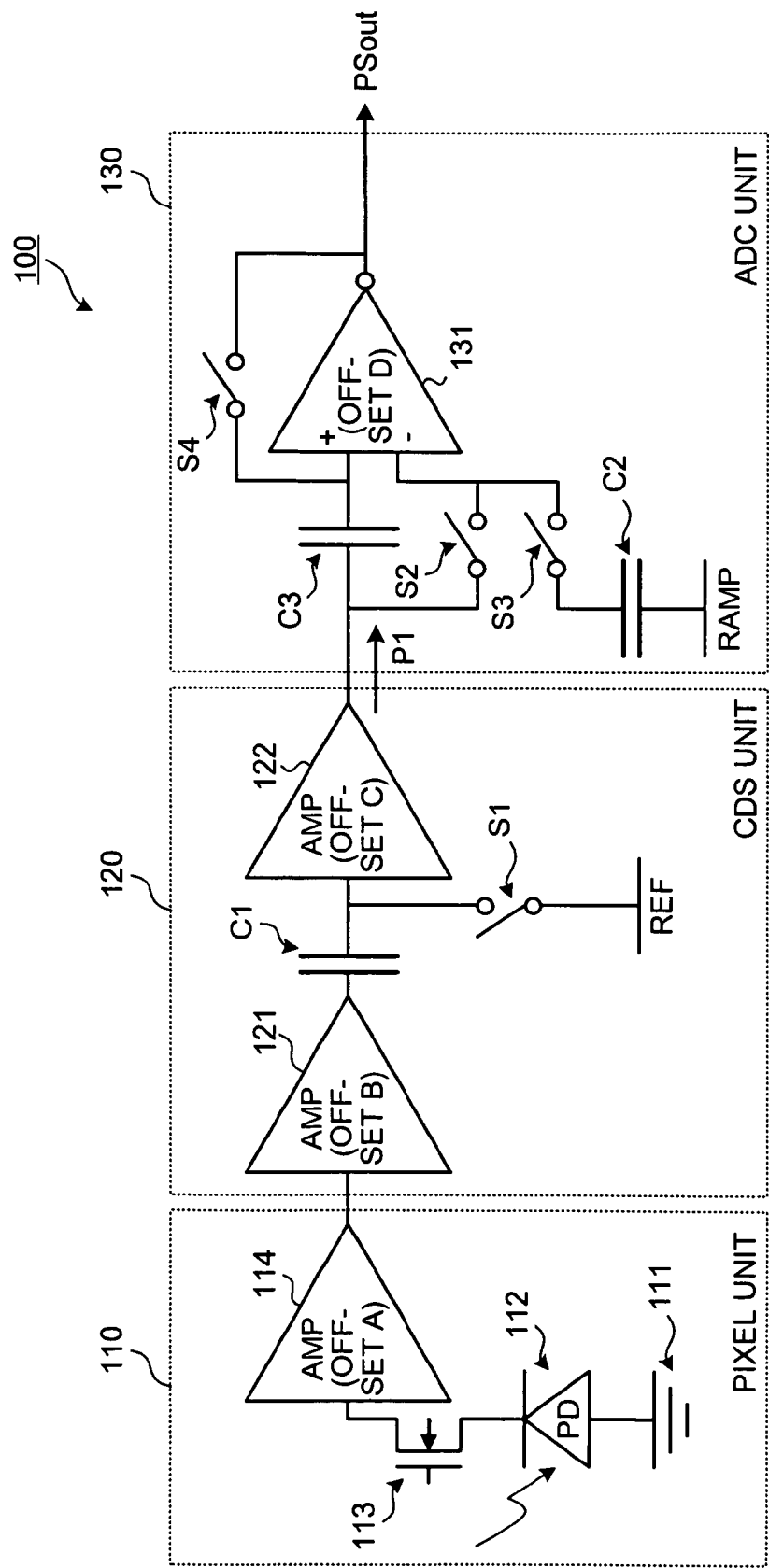
FIG. 1 is a circuit diagram of a CMOS sensor according to a first embodiment of the present invention.

FIG. 1 is a circuit diagram of a CMOS sensor according to a first embodiment of the present invention. The CMOS sensor 100 is constituted by a pixel unit 110, a CDS unit 120, and an ADC unit 130. The CMOS sensor 100 acquires both of an output (PN; Pixel Noise) in an offset state when the pixel unit 110 does not detect light and an output (PS; Pixel Signal) when the light is detected and finds a difference between two outputs to obtain a correct output with variations canceled.

The pixel unit 110 is a pixel constituted by a PD 112, a transistor 113, and an amplifier (hereinafter, "AMP") 114. The PD 112 is connected to a ground 111. When light is input to the pixel unit 110, the PD 112 generates an electric charge corresponding to the intensity of the input light. The generated electric charge is applied to a source electrode of the transistor 113. The transistor 113 transfers the electric charge generated by the PD 112 to an input terminal of the AMP 114. The AMP 114 outputs a voltage signal corresponding to the electric charge at the input terminal to the CDS unit 120 as a detected value. Since an inherent variation (hereinafter, "offset A") is generated in the AMP 114, the detected value (pixel signal PS) output to the CDS unit 120 includes this offset A.

The CDS unit 120 is constituted by a reference electric potential (hereinafter, "REF"), an AMP 121, a condenser C1, an AMP 122, and a switch S1. The REF is an electric potential of an electric potential generating unit (not shown) that is a reference for obtaining a difference with the pixel signal PS. The AMP 121 is connected between the AMP 114 and the condenser C1 and the output (detected value) from the AMP 114 is input to the AMP 121. The AMP 121 amplifies the output (detected value) from the AMP 114 to output to the condenser C1. Since an inherent variation (hereinafter, "offset B") is generated in the AMP 121, the output to the condenser C1 includes this offset B. The AMP 121 acts as an input buffer of the CDS unit 120.

The condenser C1 is connected between the AMP 121 and the AMP 122 and accumulates the electric charge as the output from the AMP 121 is input to the condenser C1. The condenser C1 also accumulates the electric charge from the REF depending on the opening and closing of the switch S1. The AMP 122 is connected to the condenser C1 and the switch S1 and performs output to the ADC unit 130.

Since an inherent variation (hereinafter, "offset C") is generated in the AMP 122, the output to the ADC unit 130 includes this offset C. This output is defined as "P1" of FIG. 1. The AMP 122 acts as an output buffer of the CDS unit. The switch S1 is connected between the condenser C1 and the REF. When the switch S1 is turned on, the electric charge of the REF is accumulated in the condenser C1 depending on the electric potential of the REF. On the other hand, when the switch S1 is turned off, the accumulation of the electric charge is stopped in the condenser C1.

The ADC unit 130 is constituted by a RAMP, condensers C2, C3, switches S2, S3, S4, and a comparator 131. The RAMP is an electric potential of a ramp generating unit (not shown) to be compared in the comparator 131. The RAMP is set to be equivalent to the electric potential of the REF.

The condenser C3 is connected between the AMP 122 of the CDS unit 120 and a positive input terminal of the comparator 131. The condenser C3 accumulates the electric charge as the output from the AMP 122 is input to the condenser C3. As the inverting output from the comparator 131 is input to the condenser C3 depending on the opening and closing of the switch S4, the condenser C3 accumulates the electric charge.

The switch S2 is connected between the AMP 122 of the CDS unit 120 and a negative input terminal of the comparator 131. When the switch S2 is turned on, the output from the AMP 122 is input to the negative input terminal of the comparator 131. On the other hand, when the switch S2 is turned off, the output to the negative input terminal of the comparator 131 is stopped.

The switch S3 is connected between the condenser C2 and the negative input terminal of the comparator 131. When the switch S3 is turned on, the RAMP signal (a voltage corresponding to the electric charge accumulated in the condenser C2) is output to the negative input terminal of the comparator 131 through the condenser C2. On the other hand, when the switch S3 is turned off, the output to the negative input terminal of the comparator 131 is stopped.

The condenser C2 is connected between the RAMP and the switch S3. When both the switches S2, S3 are turned on, the condenser C2 accumulates the electric charge corresponding to the electric potential difference between the REF and the RAMP. Specifically, although the REF and the RAMP have the same electric potential, since the AMP 122 with the offset C is arranged between the REF and the RAMP, the electric potential difference is generated by the offset C between the REF and the RAMP.

When only the switch S3 is turned on, a signal is output to the negative input terminal of the comparator 131, which is obtained by adding the RAMP signal to a signal corresponding to the offset C accumulated in the condenser C2. When the switch S3 is turned off, the electric charge corresponding to the offset C is maintained as accumulated in the condenser C2.

The comparator 131 compares the input value at the positive input terminal and the input value at the negative input terminal and inverts the output at the timing when the both input values are identical. If the input value at the positive input terminal is greater, L is output from an inverting output terminal of the comparator 131, and if the input value at the positive input terminal is equal to or less than the input value at the negative input terminal, H is output from the inverting output terminal of the comparator 131. The inverting output of the comparator 131 is returned to the positive input terminal via the switch S4. Since an inherent variation (hereinafter, "offset D") is generated in the comparator 131, the inverting output from the comparator 131 includes this offset D.

The switch S4 is connected to the inverting output terminal of the comparator 131. When the switch S4 is turned on, the inverting output of the comparator 131 is input to the condenser C3 or the positive input terminal of the comparator 131 depending on the opening and closing states of the switch S2 and switch S3. On the other hand, when the switch S4 is turned off, the input to the condenser C3 or the positive input terminal of the comparator 131 is stopped.

The detected value output from the pixel unit 110 includes the offset A that is the variation in the AMP 114 whether the detected value is the output in the offset state (PN) or the output in the state of detecting the light (PS). The detected value output from the CDS unit 120 includes the offset B that is the variation in the AMP 121 acting as an input buffer and the offset C that is the variation in the AMP 122 acting as an output buffer. Similarly, the detected value output from the ADC unit 130 includes the offset D that is the variation in the comparator 131. The CMOS sensor 100 performs an offset voltage cancellation for canceling the offsets A to D, i.e., all the variations described above, with the use of the condensers C1 to C3 and the switches S1 to S4.

Figure 2:
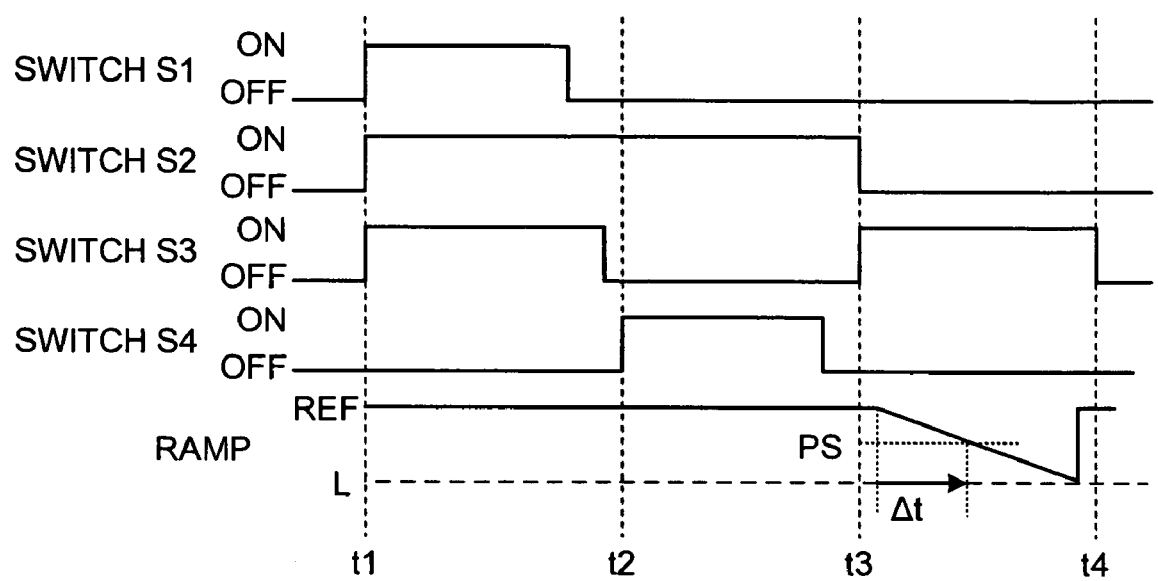
FIG. 2 is a timing chart of an offset voltage cancellation performed by the CMOS sensor.

FIG. 2 is a timing chart of an offset voltage cancellation performed by the CMOS sensor 100. FIG. 2 shows the on/off states of the switches S1 to S4 and the changes in the electric potential of the RAMP. In the initial state, the switches S1 to S4 are turned off and the electric potential of the RAMP is equal to the electric potential of the REF.

A time t1 represents the timing of acquiring the output (PN) in the offset state. At the time t1, the switch S1 is turned on and the condenser C1 shown in FIG. 1 accumulates the electric charge corresponding to the electric potential difference between the output of the AMP 121 and the REF. The output of the AMP 121 includes the offset A of the AMP 114 of the pixel unit 110 and the offset B of the AMP 121 itself. In other words, at the time t1, a voltage V1 of the condenser C1 on the side of the pixel unit 110 can be expressed as the following equation (1).

$$V1 = PN + \text{offset } A + \text{offset } B \quad (1)$$

At the same time (at the time t1), in the ADC unit 130, the switches S2 and S3 are turned on and the condenser C2 shown in FIG. 1 accumulates the electric charge corresponding to the electric potential difference between the REF and the RAMP, which is equal to the offset C of the AMP 122 that is arranged between the REF and the RAMP. In other words, the condenser C2 accumulates the offset C of the AMP 122 acting as the output buffer of the CDS unit 120. At the time t1, the switch S4 is maintained in the off state.

A time t2 represents the timing of acquiring the output (pixel signal PS) in the state of detecting the light. At the time t2, the switch S2 is changed from ON to OFF in the CDS unit 120, and the condenser C1 shown in FIG. 1 accumulates the electric charge corresponding to the electric potential difference between the output of the AMP 121 and the REF. The pixel signal PS is input to the condenser C1 through the AMP 121 from the pixel unit 110. At the time t2, a voltage V2 of the condenser C1 on the side of the pixel unit 110 can be expressed as the following equation (2).

$$V2 = PS + PN + \text{offset } A + \text{offset } B \quad (2)$$

The condenser C1 outputs a difference between the voltage V1 at the time t1 and the voltage V2 at the time t2, i.e., the pixel signal PS that is the pure detected value of the pixel unit 110 without the offsets A, B, i.e., the variations, and the PN, i.e., noises. The pixel signal PS is input into the AMP 122. Although the input to the AMP 122 does not include the offsets A and B, the output P1 from the AMP 122 includes the offset C (i.e., P1=PS+offset C).

At the time t2, in the ADC unit 130, the switch S3 is changed from ON to OFF and the electric charge accumulated in the condenser C2 is stopped being input to the negative input terminal of the comparator 131. On the other hand, the switch S4 is changed from OFF to ON and the comparator 131 is adjusted to auto zero since the positive input terminal and the negative input terminal are short-circuited. The auto zero is processing for setting a decision voltage of the comparator 131 to an optimum value. In the CMOS sensor 100 shown in FIG. 1, the setting to the optimum value is performed on the basis of the pixel signal PS and the REF of the CDS unit 120. At the same time as the auto zero, the condenser C3 accumulates the offset D that is the variation in the comparator 131.

At a time t3, in the ADC unit 130, after the switch S4 is changed from ON to OFF, the switch S2 is also changed from ON to OFF. The switch S3 is changed from OFF to ON. Consequently, the output P1 from the AMP 122 is input to the condenser C3.

As a result of the auto zero, the electric charge corresponding to the offset D is accumulated in the condenser C3. Consequently, a predetermined voltage including (PS+offset D) is input into the positive input terminal of the comparator 131. On the other hand, (RAMP+offset C) is input into the negative input terminal of the comparator 131 via the condenser C2. Thus, in the comparator 131, the offset C is cancelled by (PS+offset C)−(RAMP+offset C), and the PS and the RAMP are compared.

Description will be made of the specific comparison processing of the comparator 131 between the time t3 and time t4. As shown in FIG. 2, at the time t3, when the switch S2 is changed from ON to OFF and the switch S3 is changed from OFF to ON, the electric potential of the RAMP is linearly reduced from the REF.

The output P1 of the CDS unit 120 input to the positive input terminal of the comparator 131 is equivalent to the output (PS) in the state of detecting the light and maintains a constant voltage. Therefore, the comparator 131 outputs a match signal at the timing when the RAMP decreasing linearly becomes equivalent to the electric potential of the PS.

An electronic circuit not shown connected to the output terminal of the CMOS sensor 100 (the inverting output terminal of the comparator 131) counts a time period □t from the start of the reduction of electric potential of the RAMP until the RAMP becomes equivalent to the electric potential of the PS (until the match signal is output).

As a configuration example of the electronic circuit described above, for example, a latch circuit is used; the counter is input to one end; and to the other end, a signal is input, which is in the on state only during □t. Since the counter input to one end is output from the output of the latch only when the input of the other end is in the on state, the accurate time period until the electric potentials of the PS and the RAMP become equivalent can be obtained. Since the electric potential of the RAMP is reduced linearly, the electric potential of the PS can be obtained from the time period.

Finally, at the time t4, the comparison result (match signal) of the comparator 131 is output, and since the switch S3 is changed from ON to OFF when the electric potential of the RAMP is reduced to a lower limit L, the RAMP is returned to the electric potential equivalent to the REF and enters into the waiting state until next detection.

As described above, the first embodiment can cancel all the variations due to the offsets A to D of the semiconductor device included in each of the pixel unit 110, the CDS unit 120, and the ADC unit 130 with the use of the condensers C1 to C3. Therefore, the CMOS sensor 100 can output only the detected value PSout of the light.

Although the auto zero of the comparator 131 of the ADC unit 130 is performed at the time of the output (PS) in the state of detecting the light in the first embodiment, the auto zero of a comparator 311 of an ADC unit 310 is performed at the time of the output (PN) in the offset state when the light is not detected in a second embodiment. Therefore, as compared to the ADC unit 130 of the first embodiment, the ADC unit 310 of the second embodiment has a simpler configuration.

Figure 3:
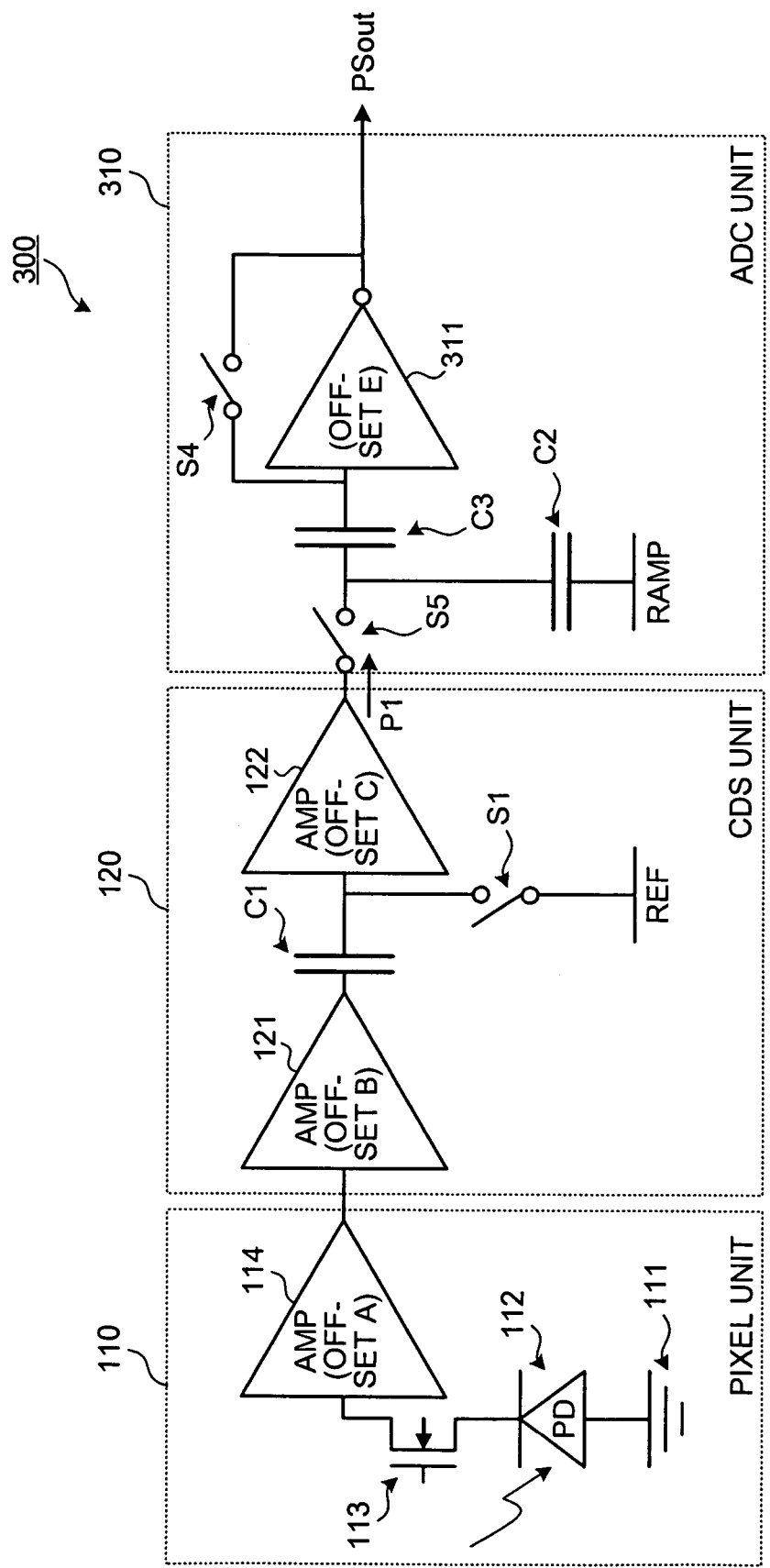
FIG. 3 is a circuit diagram of a CMOS sensor according to a second embodiment of the present invention.

FIG. 3 is a circuit diagram of a CMOS sensor according to the second embodiment of the present invention. The CMOS sensor 300 shown in FIG. 3 is configured by replacing the ADC unit 130 of the CMOS sensor 100 shown in FIG. 1 with the ADC unit 310. Therefore, description will only be made of the configuration and operation of the ADC unit 310 and the same symbols are added to the same components as the first embodiment, which will not be described here.

The ADC unit 310 is constituted by the RAMP, a switch S5, the condenser C2, the condenser C3, the comparator 311, and the switch S4. The RAMP is an electric potential of a ramp generating unit (not shown) to be compared in the comparator 131. The RAMP is set to be equivalent to the electric potential of the REF.

The switch S5 is connected between the AMP 122 of the CDS unit 120 and the condenser C3. When turned on, the switch S5 outputs the output P1 from the AMP 122 to the condenser C2 and the condenser C3. On the other hand, when turned off, the output to the condenser C2 and the condenser C3 is stopped.

The condenser C2 is connected between the RAMP and the switch S5. When the switch S5 is turned on, the condenser C2 accumulates the electric charge corresponding to the electric potential difference between the REF and the RAMP. Specifically, although the REF and the RAMP have the same electric potential, since the AMP 122 with the offset C is arranged between the REF and the RAMP, the electric potential difference is generated by the offset C between the REF and the RAMP.

The condenser C3 is connected between the switch S5 and the negative input terminal of the comparator 311. The condenser C3 accumulates the electric charge as the output from the AMP 122 is input depending on the opening and closing of the switch S5. As the inverting output from the comparator 131 is input depending on the opening and closing of the switch S4, the condenser C3 accumulates the electric charge.

The comparator 311 compares a voltage when the pixel signal is input (the input value at the positive input terminal) and a voltage when the RAMP is input (the input value at the negative input terminal) and inverts the output at the timing when the both input values are identical. The inverting output of the comparator 311 is returned to the negative input terminal via the switch S4. Since an inherent variation (hereinafter, "offset E") is generated in the comparator 311, the inverting output from the comparator 311 includes this offset E.

The switch S4 is connected to the inverting output terminal of the comparator 311. When the switch S4 is closed, the inverting output of the comparator 311 is input to the condenser C3 or the negative input terminal of the comparator 311. On the other hand, when the switch S4 is turned off, the input to the condenser C3 or the negative input terminal of the comparator 311 is stopped.

Figure 4:
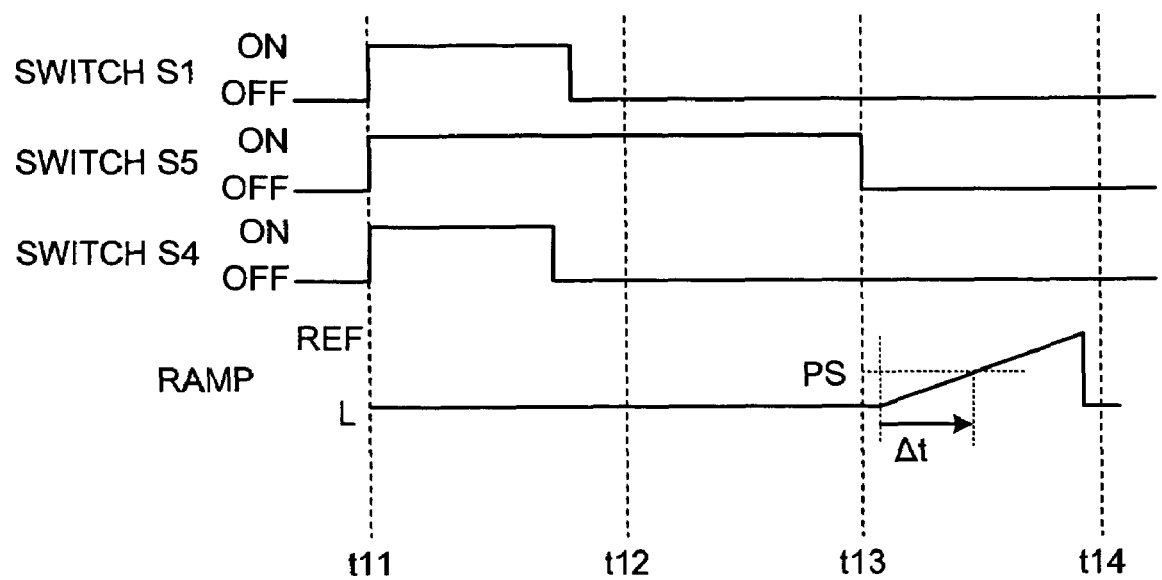
FIG. 4 is a timing chart of an offset voltage cancellation performed by the CMOS sensor.

FIG. 4 is a timing chart of an offset voltage cancellation performed by the CMOS sensor 300. FIG. 4 shows the on/off states of the switches S1, S5, S4 and the changes in the electric potential of the RAMP.

In FIG. 4, a time t11 represents the timing of acquiring the output (PN) in the offset state. At the time t11, the switch S1 is turned on in the CDS unit 120. In this case, as is the case with the first embodiment, the condenser C1 accumulates the electric charge corresponding to the electric potential difference between the output of the AMP 121 and the REF. In this case, the output of the AMP 121 includes the offset A of the AMP 114 of the pixel unit 110 and the offset B of the AMP 121 itself. In other words, at the time t11, a voltage V1 of the condenser C1 on the side of the pixel unit 110 can be expressed as the above equation (1).

At the same time, in the ADC unit 310, the switches S4, S5 are in the on state at the time t11. In this case, as shown in FIG. 3, since the input and output are short-circuited, the comparator 311 is adjusted to auto zero on the basis of the REF of the CDS unit 120. Although the adjustment to the auto zero is performed at the time of the PS in the first embodiment, the adjustment to the auto zero is performed at the time of the PN in the second embodiment.

At the time t11, as a result of the auto zero adjustment of the comparator 311, the condenser C3 accumulates the electric charge corresponding to the offset C of the AMP 122 and the offset E of the comparator 311.

A time t12 represents the timing of acquiring the output (PS) in the state of detecting the light. At the time t12, the switch S1 is changed from ON to OFF in the CDS unit 120. In this case, the condenser C1 accumulates the electric charge corresponding to the difference between the output of the AMP 121 and the REF.

The output (PS) in the state of detecting the light is input to the condenser C1 through the AMP 121 from the pixel unit 110. In other words, at the time t12, a voltage V2 of the condenser C1 on the side of the pixel unit 110 can be expressed as the above equation (2).

The condenser C1 outputs a difference between the voltage V1 at the time t11 and the voltage V2 at the time t12, i.e., the pixel signal PS that is the pure detected value of the pixel unit 110 without the offsets A, B, i.e., the variations, and the PN, i.e., noises. The pixel signal PS is input into the AMP 122. Although the input to the AMP 122 does not include the offsets A and B, the output P1 from the AMP 122 includes the offset C (i.e., P1=PS+offset C).

At the time t12, the condenser C2 accumulates the electric charge corresponding to the offset of the AMP 122. At a time t13, the switch S5 is changed from ON to OFF, and the RAMP comparing period begins. The offset C, which is accumulated in the condensers C2 and C3, and the offset E, which is accumulated in the condenser C3, are cancelled when the RAMP inputs into the comparator 311 through the condensers C2 and C3.

Description will be made of the specific comparison processing of the comparator 311 between the time t13 and time t14. As shown in FIG. 4, at the time t13, when the switch S5 is changed from ON to OFF, the electric potential of the RAMP input to the input terminal of the comparator 311 is linearly increased from the lower limit L to the REF, which is the upper limit.

The output P1 of the CDS unit 120 input to the positive input terminal of the comparator 131 is equivalent to the output (PS) in the state of detecting the light and maintains a constant voltage. Therefore, the comparator 311 outputs a match signal at the timing when the RAMP increasing linearly becomes equivalent to the electric potential at the time of the auto zero that is input to the input terminal of the comparator 131 at the time t11.

An electronic circuit not shown connected to the output terminal of the CMOS sensor 300 (the inverting output terminal of the comparator 311) counts a time period □t from the start of the increase of electric potential of the RAMP input to the input terminal of the comparator 311 until the RAMP becomes equivalent to the electric potential of the PS (until the match signal is output). This counted value is detected as a value corresponding to the accurate electric potential of the PS.

Finally, at the time t14, the comparison result (match signal) of the comparator 311 is output, and when the electric potential of the RAMP is increased to the upper limit REF, i.e., the electric potential of the RAMP is actually decreased to the lower limit L because of the inversion, the RAMP is returned to the original electric potential (electric potential equivalent to the REF) and enters into the waiting state until next detection.

As described above, since the second embodiment performs the auto zero adjustment and the offset accumulation simultaneously at the time of the PN, the switches S2, S3 shown in FIG. 1 are not needed. Therefore, the cancellation of the variations can be achieved with the configuration simpler than the first embodiment.

Although the AMP 122 of the CDS unit 120 acting as the output buffer uniquely amplifies the input detected value in the second embodiment, only a signal portion of the input detected value can be amplified and output to the ADC unit 310 in a third embodiment by using a forward amplifier instead of the AMP 122.

Figure 5:
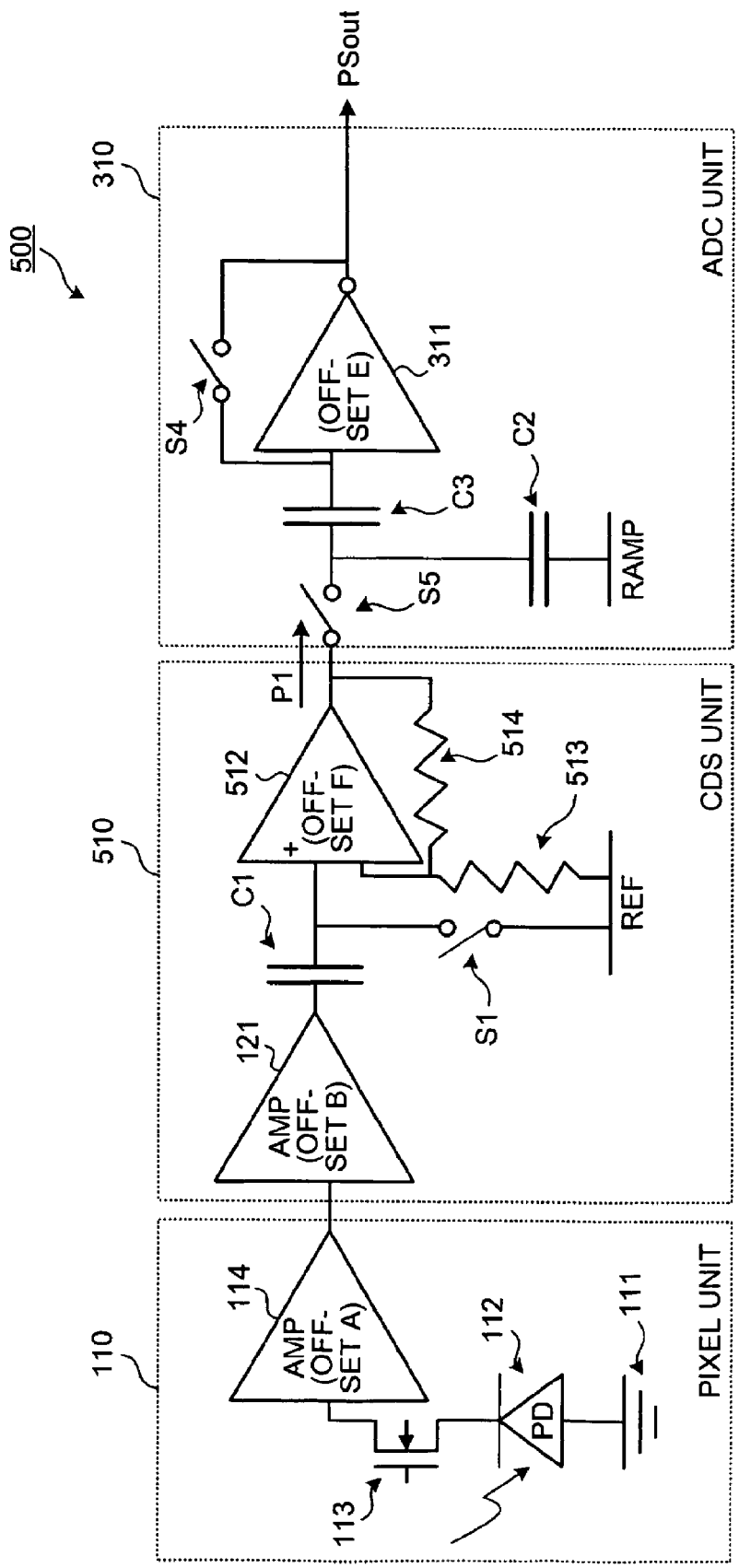
FIG. 5 is a circuit diagram of a CMOS sensor according to a third embodiment of the present invention.

FIG. 5 is a circuit diagram of a CMOS sensor according to the third embodiment of the present invention. The CMOS sensor 500 shown in FIG. 5 is configured by adding a forward amplifier composed of a comparator 512 and resistors 513, 514 instead of the AMP 122 in the CDS unit 120 of the CMOS sensor 300 shown in FIG. 3. Therefore, the same symbols are added to the same components as the second embodiment, which will not be described here.

In the CMOS sensor 500, a CDS unit 510 is constituted by the AMP 121, the condenser C1, the switch S1, the comparator 512, resistors 513, 514, and the REF.

The comparator 512 has a positive input terminal connected to the condenser C1, a negative input terminal connected to the REF through the resistor 513, and an output terminal connected to the ADC unit 310. The positive input terminal is also connected to the REF via the switch S1. The output terminal returns to the negative input terminal through the resistor 514. Since an inherent variation (hereinafter, "offset F") is generated in the comparator 512, the output P1 of the comparator 512 includes this offset F.

The signal PS, which is the pure detected value of the pixel unit 110 without the offsets A, B, and the PN, is input into the positive input terminal of the comparator 512. The resistors 513, 514 are elements used for amplifying the signal PS input to the positive input terminal of the comparator 512. Specifically, only the signal component of the signal PS can be amplified by a predetermined gain with a resistance ratio set by resistance values of the resistor 513, 514. Since the offsets A, B are already cancelled in the signal PS, when the signal PS is amplified by the comparator 512, the offsets A, B generating noises are not amplified.

Although the comparator 512 outputs the signal P1 from the output terminal, the signal P1 includes the offset F due to the comparator P1 as well. Therefore, as is the case with the offset C in the second embodiment, processing is performed for canceling the offset F with the use of the condenser C2 of the ADC unit 310. Since the specific processing detail is the same as the second embodiment, the description thereof is omitted.

A timing chart showing the offset voltage cancellation for the variations (offsets A, B, E, F) in the output of the CMOS sensor 500 is the same as the timing chart shown in FIG. 4. In the description of the timing chart shown in FIG. 4, the "offset C" is replaced with the "offset F".

In this way, the third embodiment has the same effect as the second embodiment. In the third embodiment, the output P1 from the comparator 512 is a signal with only the signal component of the signal PS amplified and does not includes the noise component and the offsets A, B of the signal PS. Therefore, by outputting the output P1 to the ADC unit 310, the effect of the noise can be reduced before the digital conversion with the ADC unit 310. Therefore, an image with a good S/N ratio can be provided.

As described above, according to the CMOS sensors 100, 300, 500 according to the first to third embodiments, all the offsets generating the variations in the semiconductor devices (AMP, comparator) can be cancelled with a simple configuration where only the condensers C1 to C3 are added to the basic configuration of the conventional CMOS sensor. Therefore, the vertical stripes are prevented from being generated and a high-quality image can be provided.

Since the added condensers C1 to C3 can accumulate noises generated due to the temperature change and the power fluctuation in the REF and the RAMP, the noises can be prevented from being output to the comparators 131, 311. Therefore, a high-quality image can be provided.

As set forth hereinabove, the CMOS sensor of the present invention enables a high-quality image to be displayed with a simple configuration.

According to the present invention, a high-quality image can be displayed with a simple configuration.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. An image sensor comprising:
   a pixel unit that outputs a first signal including an offset voltage inherent to a pixel;
   a correlated double sampling (CDS) unit that performs correlated double sampling of a second signal that is obtained from the first signal by cancelling the offset voltage inherent to the pixel, and outputs the second signal after the correlated double sampling as a third signal including an offset voltage due to the CDS unit; and
   an analog-to-digital converter (ADC) unit that performs analog-to-digital conversion of a fourth signal that is obtained from the third signal by cancelling the offset voltage due to the CDS unit, wherein
   the pixel unit includes:
   a first element that has a first offset voltage and outputs a first detected value including the first offset voltage, and
   the CDS unit includes:
   a second element that has a second offset voltage and is provided with the first detected value to output a second detected value including the second offset voltage;
   a third element that has a third offset voltage and is provided with the second detected value to output a third detected value including the third offset voltage;
   a first condenser that is arranged between the second element and the third element;
   a reference-signal output unit that outputs a reference signal; and
   a first switch that is arranged between the reference-signal output unit and the third element.

2. The image sensor according to claim 1, wherein the ADC unit cancels the offset voltage due to the CDS unit by a first accumulating unit that accumulates the offset voltage due to the CDS unit.

3. The image sensor according to claim 2, wherein the first accumulating unit is a condenser.

4. The image sensor according to claim 2, wherein the ADC unit cancels an offset voltage due to the ADC unit itself by a second accumulating unit that accumulates the offset voltage due to the ADC unit.

5. The image sensor according to claim 4, wherein the second accumulating unit is a condenser.

6. The image sensor according to claim 1, wherein the image sensor controls an ON/OFF operation of the first switch such that electric charges are accumulated in the first condenser and that the first offset voltage and the second offset voltage are cancelled by the electric charges.

7. The image sensor according to claim 1, wherein the ADC unit includes:
   a RAMP-signal output unit that outputs a RAMP signal;
   a comparator that has a fourth offset voltage and includes a positive input terminal, a negative input terminal, and an output terminal, the positive input terminal being provided with the third detected value, the negative input terminal being provided with the RAMP signal;

a second condenser that is arranged between the third element and the positive input terminal;
a second switch that is arranged between the third element and the negative input terminal;
a third condenser that is arranged between the RAMP-signal output unit and the negative input terminal;
a third switch that is arranged between the third condenser and the negative input terminal; and
a fourth switch that is arranged between the output terminal and the positive input terminal.

8. The image sensor according to claim 7, wherein the image sensor controls ON/OFF operations of the first switch, the second switch, the third switch, and the fourth switch such that electric charges are accumulated in the second condenser and the third condenser and that the third offset voltage and the fourth offset voltage are cancelled by the electric charges.

9. The image sensor according to claim 1, wherein the ADC unit includes:
a comparator that has a fourth offset voltage and is provided with the third detected value;
a second switch that is arranged between an output terminal of the comparator and an input terminal of the comparator;
a third switch that is arranged between the third element and the comparator;
a second condenser that is arranged between the third switch and the comparator;
a RAMP-signal output unit that outputs a RAMP signal; and
a third condenser that is arranged between the RAMP-signal output unit and the second condenser.

10. The image sensor according to claim 9, wherein the image sensor controls ON/OFF operations of the first switch, the second switch, and the third switch such that electric charges are accumulated in the second condenser and the third condenser and that the third offset voltage and the fourth offset voltage are cancelled by the electric charges.

11. An image sensor comprising:
a pixel unit that outputs a first signal including an offset voltage inherent to a pixel;
a correlated double sampling (CDS) unit that performs correlated double sampling of a second signal that is obtained from the first signal by cancelling the offset voltage inherent to the pixel, and outputs the second signal after the correlated double sampling as a third signal including an offset voltage due to the CDS unit; and
an analog-to-digital converter (ADC) unit that performs analog-to-digital conversion of a fourth signal that is obtained from the third signal by cancelling the offset voltage due to the CDS unit,
wherein
the pixel unit includes:
a first element that has a first offset voltage and outputs a first detected value including the first offset voltage, and
the CDS unit includes:
a second element that has a second offset voltage and is provided with the first detected value to output a second detected value including the second offset voltage;
a comparator that has a third offset voltage and is provided with the second detected value;
a reference-signal output unit that outputs a reference signal; and
a forward amplifier that includes:
a first switch that is arranged between the reference-signal output unit and a positive input terminal of the comparator;
a first resistor that is arranged between the reference-signal output unit and a negative input terminal of the comparator; and
a second resistor that is arranged between the first resistor and an output terminal of the comparator.

12. The image sensor according to claim 11, wherein the image sensor controls an ON/OFF operation of the first switch such that electric charges are accumulated in the first condenser and that the first offset voltage and the second offset voltage are cancelled by the electric charges.

13. The image sensor according to claim 11, wherein the ADC unit includes:
a comparator that has a fourth offset voltage and is provided with the third detected value;
a second switch that is arranged between an output terminal of the comparator and an input terminal of the comparator;
a third switch that is arranged between the forward amplifier and the comparator;
a second condenser that is arranged between the third switch and the comparator;
a RAMP-signal output unit that outputs a RAMP signal; and
a third condenser that is arranged between the RAMP-signal output unit and the second condenser.

14. The image sensor according to claim 13, wherein the image sensor controls ON/OFF operations of the first switch, the second switch, and the third switch such that electric charges are accumulated in the second condenser and the third condenser and that the third offset voltage and the fourth offset voltage are cancelled by the electric charges.

15. The image sensor according to claim 11, wherein the CDS unit cancels the offset voltage inherent to the pixel by an accumulating unit that accumulates the offset voltage inherent to the pixel.

16. The image sensor according to claim 15, wherein the accumulating unit is a condenser.

17. The image sensor according to claim 15, wherein the ADC unit cancels the offset voltage due to the CDS unit by a first accumulating unit that accumulates the offset voltage due to the CDS unit.

18. The image sensor according to claim 17, wherein the first accumulating unit is a condenser.

19. The image sensor according to claim 17, wherein the ADC unit cancels an offset voltage due to the ADC unit itself by a second accumulating unit that accumulates the offset voltage due to the ADC unit.

20. The image sensor according to claim 19, wherein the second accumulating unit is a condenser.

* * * * *